US010529595B2

(12) United States Patent
Lee et al.

(10) Patent No.: US 10,529,595 B2
(45) Date of Patent: Jan. 7, 2020

(54) APPARATUS AND METHOD FOR TREATING SUBSTRATE AND MEASURING THE WEIGHT OF THE REMAINING LIQUID ON THE SUBSTRATE

(71) Applicant: SEMES CO., LTD., Chungcheongnam-do (KR)

(72) Inventors: Hyo Won Lee, Chungcheongnam-do (KR); Young Hun Lee, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 4 days.

(21) Appl. No.: 15/607,361

(22) Filed: May 26, 2017

(65) Prior Publication Data
US 2017/0345688 A1 Nov. 30, 2017

(51) Int. Cl.
*H01L 21/67* (2006.01)
*B05C 11/10* (2006.01)
*B05C 5/00* (2006.01)
*B05C 5/02* (2006.01)
*H01L 21/677* (2006.01)

(52) U.S. Cl.
CPC ........ *H01L 21/67051* (2013.01); *B05C 5/004* (2013.01); *B05C 5/02* (2013.01); *B05C 11/1005* (2013.01); *H01L 21/6719* (2013.01); *H01L 21/67023* (2013.01); *H01L 21/67034* (2013.01); *H01L 21/67109* (2013.01); *H01L 21/67178* (2013.01); *H01L 21/67253* (2013.01); *H01L 21/67703* (2013.01)

(58) Field of Classification Search
None
See application file for complete search history.

(56) References Cited

U.S. PATENT DOCUMENTS

| 5,321,634 A * | 6/1994 | Obata ..................... G01G 9/00 177/25.11 |
| 5,625,170 A * | 4/1997 | Poris ..................... G01G 17/00 177/1 |
| 6,902,647 B2 * | 6/2005 | Hasper .............. H01L 21/67161 118/719 |

(Continued)

FOREIGN PATENT DOCUMENTS

JP 2000012430 A * 1/2000
KR 10-2000-0031299 A 6/2000

(Continued)

OTHER PUBLICATIONS

Translation of Korean written opinion (Year: 2018).*
Examination Report for KR App No. 10-2016-0065852 dated Apr. 24, 2018 (10 pages).

*Primary Examiner* — Binu Thomas
(74) *Attorney, Agent, or Firm* — Procopio, Cory, Hargreaves & Savitch LLP

(57) ABSTRACT

Disclosed are an apparatus and a method for liquid-treating a substrate. An apparatus for treating a substrate includes a liquid treating unit that liquid-treats a substrate by supplying a liquid onto a substrate, a weight measuring unit that measures a weight of the remained liquid on the substrate, and a transfer unit that transfers the substrate between the liquid treating unit and the weight measuring unit. Accordingly, the weight of the remained liquid may be measured more promptly.

5 Claims, 11 Drawing Sheets

(56) References Cited

U.S. PATENT DOCUMENTS

2012/0048304 A1* 3/2012 Kitajima ........... H01L 21/67034
  134/30
2015/0155448 A1* 6/2015 Matsunaga ............... B05C 5/02
  118/708
2017/0345680 A1* 11/2017 Lee ................... H01L 21/67051

FOREIGN PATENT DOCUMENTS

| KR | 10-2005-0076264   | 7/2005  |
| KR | 10-2012-0058804 A | 6/2012  |
| KR | 10-2013-0052997 A | 5/2013  |
| KR | 10-2014-0119740 A | 10/2014 |
| KR | 10-2015-0077536   | 7/2015  |

* cited by examiner

APPARATUS AND METHOD FOR TREATING SUBSTRATE AND MEASURING THE WEIGHT OF THE REMAINING LIQUID ON THE SUBSTRATE

CROSS-REFERENCE TO RELATED APPLICATIONS

A claim for priority under 35 U.S.C. § 119 is made to Korean Patent Application No. 10-2016-0065852 filed May 27, 2016, in the Korean Intellectual Property Office, the entire contents of which are hereby incorporated by reference.

BACKGROUND

The inventive concept relates to an apparatus and a method for treating a substrate with a liquid.

In order to manufacture a semiconductor device, a desired pattern is formed on a substrate through various processes such as, photographing, etching, ashing, ion injection, and deposition of thin films. Various treatment liquids are used in the processes, and contaminants and particles are generated during the process. In order to solve this, a cleaning process for cleaning contaminants and particles is performed before and after the process.

In general, the cleaning process includes a liquid treating process and a drying process. In the liquid treating process, a treatment liquid is supplied onto the substrate, and in the drying process, the remained liquid on the substrate is removed. The liquid treating process includes an operation of chemical-treating a substrate and substituting the remained liquid on the substrate with an organic solvent. If the treated surface of the substrate is substituted by the organic solvent, a drying process for removing the organic solvent is performed.

The drying process is performed in a chamber that is different from that of the liquid treating process. Accordingly, the substrate, on which the liquid treating process has been performed, is transferred from the liquid treating chamber to the drying chamber. Then, when the organic solvent residing on the substrate is greater than a preset range, the organic solvent acts as particles, contaminating the peripheral devices. Unlike this, when the amount of the organic solvent is smaller than the preset range, a process defect is caused by a leaning phenomenon of a pattern.

Further, a volatile material is provided as a generally used organic solvent, and a portion of the organic solvent may be volatilized while the substrate is transferred.

Accordingly, in a process of setting up a substrate treating system, the weight of the substrate is measured such that the organic solvent residing on the substrate is within a preset range.

If the liquid treating process of the substrate is completed, the weight of the substrate is measured after the substrate is directly extracted from the substrate treating system by the operator, and is carried into the substrate treating system again.

However, the substrate treating system has different internal and external environments. Due to this, even when the weight of the substrate measured on the outside is within a preset range, the weight of the remained liquid may deviate from the preset range during an actual process.

Further, much time may be spent in a process of directly carrying the substrate into and out of the substrate treating system by the operator.

Further, the remained liquid may be volatilized while the operator extracts the substrate from the system, and thus the operator may be exposed to the remained liquid, which does harm to the human body.

SUMMARY

The inventive concept provides an apparatus and a method for promptly setting up a substrate treating system.

The inventive concept provides an apparatus and a method for measuring a weight of a remained liquid on a substrate in an actual substrate treating environment.

The inventive concept also provides an apparatus and a method for preventing remained liquid from being exposed to an operation while the weight of the remained liquid is measured.

Embodiments of the inventive concept provide an apparatus and a method for liquid-treating a substrate. An apparatus for treating a substrate includes a liquid treating unit that liquid-treats a substrate by supplying a liquid onto a substrate, a weight measuring unit that measures a weight of the remained liquid on the substrate, and a transfer unit that transfers the substrate between the liquid treating unit and the weight measuring unit.

The apparatus may further include a buffer unit that temporarily preserves the substrate, and the weight measuring unit may be provided in the buffer unit. The buffer unit may include a buffer chamber having a buffer space, in which the substrate is accommodated, and the weight measuring unit and the buffer chamber may be stacked on each other. The liquid may be isopropyl alcohol (IPA). The apparatus may further include a controller that controls the transfer unit, and the controller may control the transfer unit to transfer the substrate to the weight measuring unit before the substrate is carried into the liquid treating unit, and transfer the substrate liquid-treated by the liquid treating unit to the weight measuring unit. The controller may receive a pre-treatment weight of the substrate from the weight measuring unit before the substrate is carried into the liquid treating unit and may receive a post-treatment weight of the substrate carried out of the liquid treating unit from the weight measuring unit, and calculates the weight of the remained liquid on the substrate based on a difference between the pre-treatment weight and the post-treatment weight. If the calculated weight of the liquid deviates from a preset value, the controller may adjust the flow amount of the liquid supplied from the liquid treating unit such that the weight of the liquid includes the preset value.

A method for treating a substrate may include liquid-treating the substrate by a liquid treating unit, and measuring a weight of the remained liquid on the substrate.

The weight of the liquid may be measured by a weight measuring unit provided in a buffer unit in which the substrate is temporarily preserved. The liquid-treating of the substrate may include supplying a treatment liquid onto the substrate, and the liquid may be isopropyl alcohol (IPA). The measuring of the weight includes measuring a pre-treatment weight of the substrate, before the liquid-treating of the substrate, and measuring a post-treatment weight of the substrate, after the liquid-treating of the substrate.

The method may further include calculating a weight of the remained liquid based on a difference between the pre-treatment weight and the post-treatment weight after the measuring of the post-treatment weight. The method may further include after the calculating of the weight, if the weight of the liquid deviates from a preset value, adjusting a flow amount of the liquid supplied from the liquid treating chamber to the substrate such that the weight of the liquid includes the preset value.

An apparatus for treating a substrate may include a liquid treating unit that liquid-treats a substrate by supplying a liquid onto a substrate, a drying unit that dries the substrate liquid-treated by the liquid treating unit, a weight measuring unit that measures a weight of the remained liquid on the substrate, and a transfer unit that transfers the substrate between any two of the liquid treating unit, the drying unit, and the weight measuring unit.

The apparatus may further include a buffer unit that temporarily preserves the substrate, and the weight measuring unit may be provided in the buffer unit. The apparatus may further include a controller that controls the transfer unit, and the controller may control the transfer unit to transfer the substrate to the weight measuring unit before the substrate is carried into the liquid treating unit, and transfer the substrate liquid-treated by the liquid treating unit to the weight measuring unit. The controller may receive a pre-treatment weight of the substrate from the weight measuring unit before the substrate is carried into the liquid treating unit and may receive a post-treatment weight of the substrate carried out of the liquid treating unit from the weight measuring unit, and may calculate the weight of the remained liquid on the substrate based on a difference between the pre-treatment weight and the post-treatment weight.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
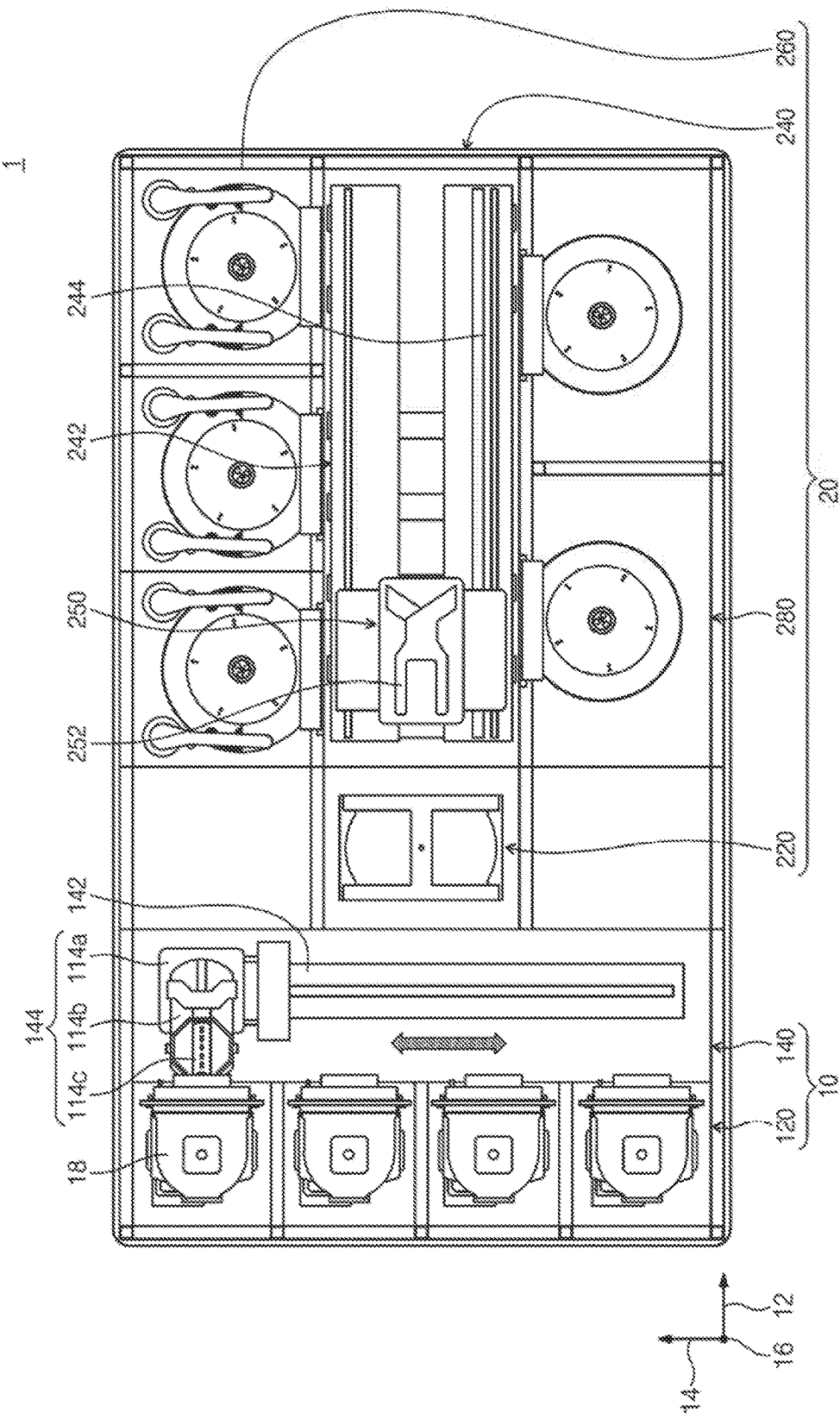
FIG. 1 is a plan view illustrating a substrate treating system according to a first embodiment of the inventive concept.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

An embodiment of the inventive concept will be described with reference to FIGS. 1 to 11.

FIG. 1 is a plan view illustrating a substrate treating system according to a first embodiment of the inventive concept.

Referring to FIG. 1, the substrate treating system 1 has an index module 10 and a process treating module 20, and the index module 10 includes a plurality of load ports 120 and a feeding frame 140. The load ports 120, the feeding frame 140, and the process treating module 20 may be sequentially arranged in a row. Hereinafter, a direction in which the load ports 120, the feeding frame 140, and the process treating module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18, in which a substrate W is received, is seated on the load port 120. A plurality of load ports 120 are provided, and are arranged along the second direction 14 in a row. FIG. 1 illustrates that four load ports 120 are provided. However, the number of the load ports 120 may increase or decrease according to a condition, such as the process efficiency of the process treating module 20 or a footprint. A plurality of slots (not illustrated) provided to support peripheries of substrates are formed in the carrier 18. A plurality of slots are provided along the third direction 16, and the substrate is situated in the carrier 18 such that the substrates are stacked to be spaced apart from each other along the third direction 16. A front opening unified pod (FOUP) may be used as the carrier 18.

The feeding frame 140 transports the substrates W between the carrier 18 seated on the load port 120 and the buffer unit 220. An index rail 142 and an index robot 144 are provided in the feeding frame 140. The index rail 142 is arranged such that the lengthwise direction thereof is in parallel to the second direction 14. The index robot 144 is installed on the index rail 142, and is linearly moved in the second direction 14 along the index rail 142. The index robot 144 has a base 114a, a body 114b, and a plurality of index arms 114c. The base 114a is installed to be moved along the index rail 142. The body 114b is coupled to the base 114a. The body 114b is provided to be moved along the third direction 16 on the base 114a. The body 114b is provided to be rotated on the base 114a. The index arms 114c are coupled to the body 114b, and are provided to be moved forwards and rearwards with respect to the body 114b. A plurality of index arms 114c are provided to be driven individually. The index arms 114c are arranged to be stacked so as to be spaced apart from each other along the third direction 16. Some of the index arms 114c are used when the substrates W are transported to the carrier 18 in the process module 20, and some of the index arms 114c may be used when the substrates W are transported from the carrier 18 to the process treating module 20. This structure may prevent particles generated from the substrates W before the process treatment from being attached to the substrates W after the process treatment in the process of carrying the substrates W in and out by the index robot 144.

The process treating module 20 includes a buffer unit 220, a weight measuring unit 500, a transfer unit 240, a first process chamber 260, a second process chamber 280, and a controller 600.

Figure 2:
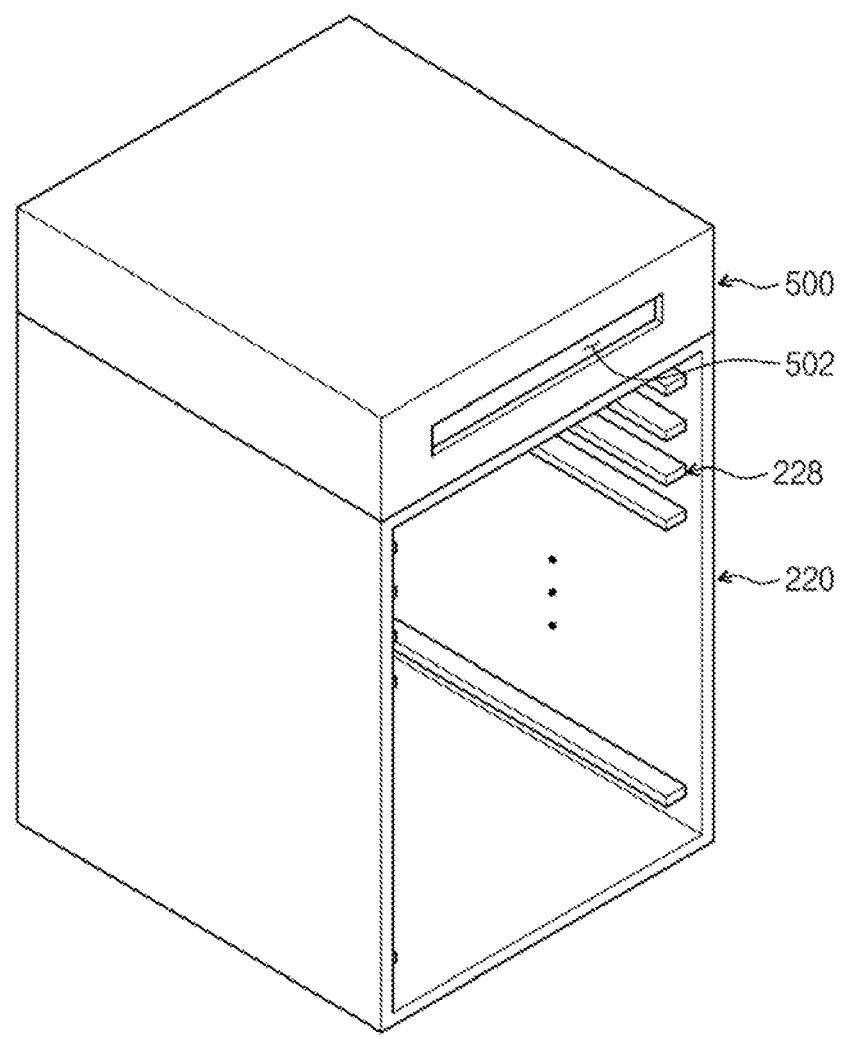
FIG. 2 is a perspective view illustrating a buffer unit and a weight measuring unit of FIG. 1.
Figure 3:
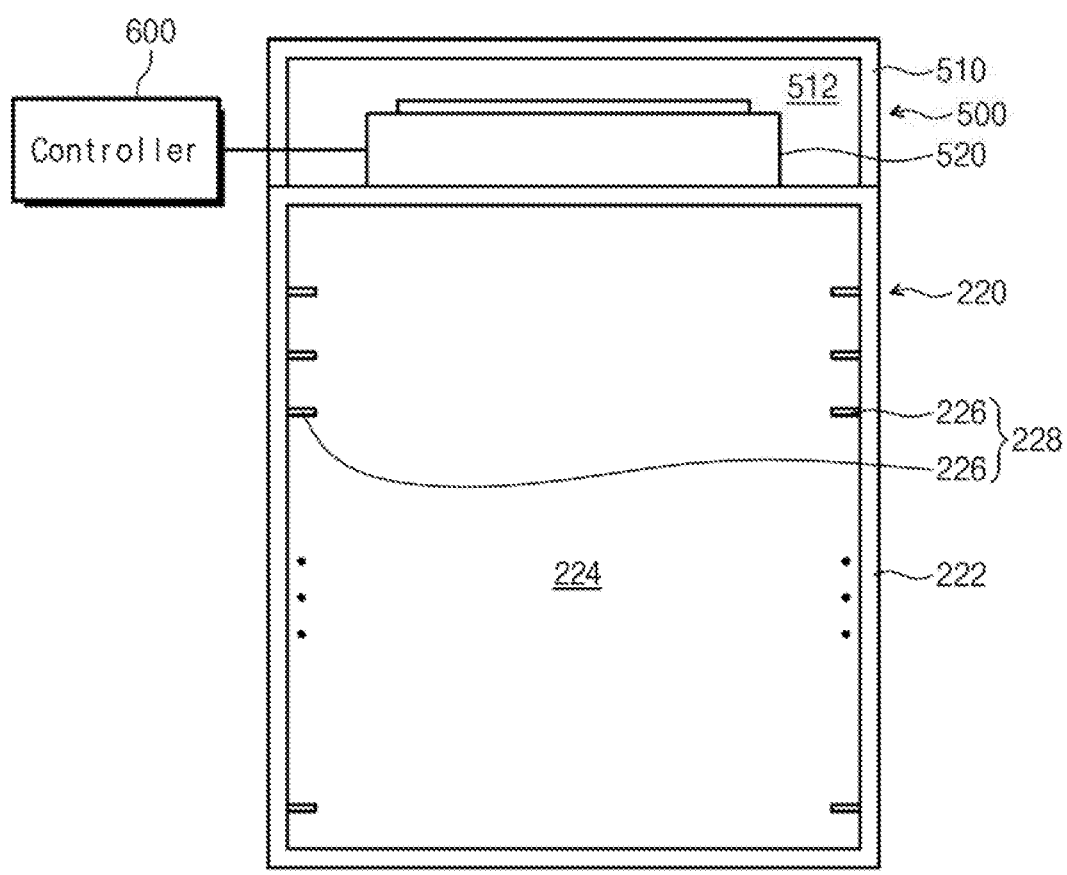
FIG. 3 is a sectional view illustrating the buffer unit and the weight measuring unit of FIG. 2.

The buffer unit 220 is arranged between the feeding frame 140 and the transfer unit. The buffer unit 220 provides a space in which the substrates W stay before being transported, between the transfer unit and the feeding frame 140. FIG. 2 is a perspective view illustrating a buffer unit and a weight measuring unit of FIG. 1. FIG. 3 is a sectional view illustrating the buffer unit and the weight measuring unit of FIG. 2. Referring to FIGS. 2 and 3, the buffer unit 220 includes a buffer chamber 222 and a slot member 228. The buffer chamber 222 has a hexahedral shape, opposite side surfaces of which are opened. The buffer chamber 222 has a buffer space 224 in which a substrate W is temporarily preserved. The opened side surfaces of the buffer chamber 222 function as entrances, through which the substrate W is carried in and out. One opened side surface of the buffer chamber 222 is a surface that faces the feeding frame 140, and the opposite opened side surface of the buffer chamber 222 is a surface that faces the transfer unit 240.

The slot member 228 supports the substrate in the buffer space 224. A plurality of slot members 228 are provided to be spaced apart from each other vertically. The number of the slot members 228 may be the total number of the hands or more. Each of the slot members 228 has a plurality of support slots 226 for receiving the substrate W while the substrate W being arranged in parallel to the ground surface. For example, the slot member 228 may include two facing support slots 226. The facing support slots 226 may be located on opposite inner surfaces of the buffer chamber 222. The slot members (hereinafter, upper slot members) located in an upper area of the buffer space 224 may be spaced apart from each other by a first interval. The slot members (hereinafter, lower slot members) located in a lower area of the buffer space 224 may be spaced apart from each other by a first interval. The lowermost support slot 226 of the upper slot member 228 and the uppermost slot member of the lower slot member 228 may be spaced apart from each other by a second interval that is greater than the first interval. According to an embodiment, one of the upper slot member and the lower slot member is a slot member for carrying the substrate W from the transfer unit 240 into the buffer space 224, and the other of the upper slot member and the lower slot member is a slot member for carrying out the substrate W preserved in the buffer space 224 from the transfer unit 240.

The weight measuring unit 500 measures the weight of the substrate W. The weight measuring unit 500 includes a housing 510 and a measurement member 520. The housing 510 has a tub shape having a measurement space 512 in the interior thereof. The housing 510 is located to be stacked in the buffer chamber 222. The housing 510 is located on the buffer chamber 222. For example, the housing 510 may be provided to have a hexahedral shape. An opening is formed on one side surface of the housing 510. The one side surface of the housing 510 faces a first direction. The one side surface of the housing 510 faces the transfer chamber. The opening 502 functions as an inlet through which the substrate W may be carried into the measurement space 512. The opening 502 has a slit shape.

The measurement member 520 is located in the measurement space 512. The measurement member 520 measures the weight of the substrate W carried into the measurement space 512. The weight information measured by the measurement member 520 is delivered to the controller 600. According to an embodiment, the measurement member 520 may be an electronic scale.

Referring back to FIG. 1, the transfer unit 240 transfers the substrate W between any two of the buffer unit 220, the first process chambers 260, and the second process chambers 280. The transfer unit 240 includes a transfer chamber 242 and a transfer robot 250. The transfer chamber 242 has a length that faces a first direction 12. A transfer space for transferring the substrate W is provided in the interior of the transfer chamber 242. A transfer rail 244 is installed in the transfer space. The transfer rail 244 has a lengthwise direction that is parallel to the transfer chamber 242.

The first process chambers 260 are arranged on one side of the transfer chamber 242 along a second direction 14, and the second process chambers 280 are arranged on an opposite side thereof. The first process chambers 260 and the second process chambers 280 may be arranged to be symmetrical to each other with respect to the transfer chamber 242. Some of the first process chambers 260 are arranged along the lengthwise direction of the transfer chamber 242. Furthermore, some of the first process chambers 260 are arranged to be stacked on each other. That is, the first process chambers 260 having an array of A by B (A and B are natural numbers) may be arranged on one side of the transfer chamber 242. Here, A is the number of the first process chambers 260 provided in a row along the first direction 12, and B is the number of the first process chambers 260 provided in a row along the third direction 16. When four or six first process chambers 260 are provided on one side of the transfer chamber, the first process chambers 260 may be arranged in an array of 2 by 2 or 3 by 2. The number of the first process chambers 260 may increase or decrease. Similarly to the first process chambers 260, the second process chambers 280 may be arranged in an array of M by N (M and N are natural numbers). Here, M and N may be same numbers as A and B. Unlike the above description, the first process chambers 260 and the second process chambers 280 may be provided only on one side of the transfer chamber 242. Further, unlike the above description, the first process chambers 260 and the second process chambers 280 may be provided on opposite sides of the transfer chamber in a single layer. Further, unlike the above description, the first process chambers 260 and the second process chambers 280 may be provided in various arrangements.

The transfer robot 250 transfers the substrate W. Further, the transfer robot 250 may linearly reciprocally move in a lengthwise direction of the transfer rail 244. The transfer robot 250 has a plurality of hands 252, and the hands 252 may be independently driven. The substrate W may be seated on the hand 252 in a horizontal state. The transfer robot 250 may be elevated upwards and downwards and may be rotated about a vertical axis thereof. Further, the hands 252 may be moved forwards and rearwards. For example, four hands 252 are provided, and some of the hands 252 may transfer the substrate W before a process and the others of the hands 252 may transfer the substrate W after the process.

The first process chamber 260 and the second process chamber 280 may sequentially perform a process on one substrate W. The first process chamber 260 may be provided as a liquid treating unit that liquid-processes the substrate and the second process chamber 280 may be provided as a drying unit that removes remained liquid on the substrate For example, a chemical process, a rinsing process, and a solvent substitution process may be performed on the substrate W in the first process chamber 260, and a drying process may be performed in the second process chamber 260. In this case, the substitution process may be performed by an organic solvent, and the drying process may be performed by a supercritical fluid. An isopropyl alcohol (IPA) liquid may be used as an organic solvent, and carbon dioxide ($CO_2$) may be used as a supercritical fluid.

Figure 4:
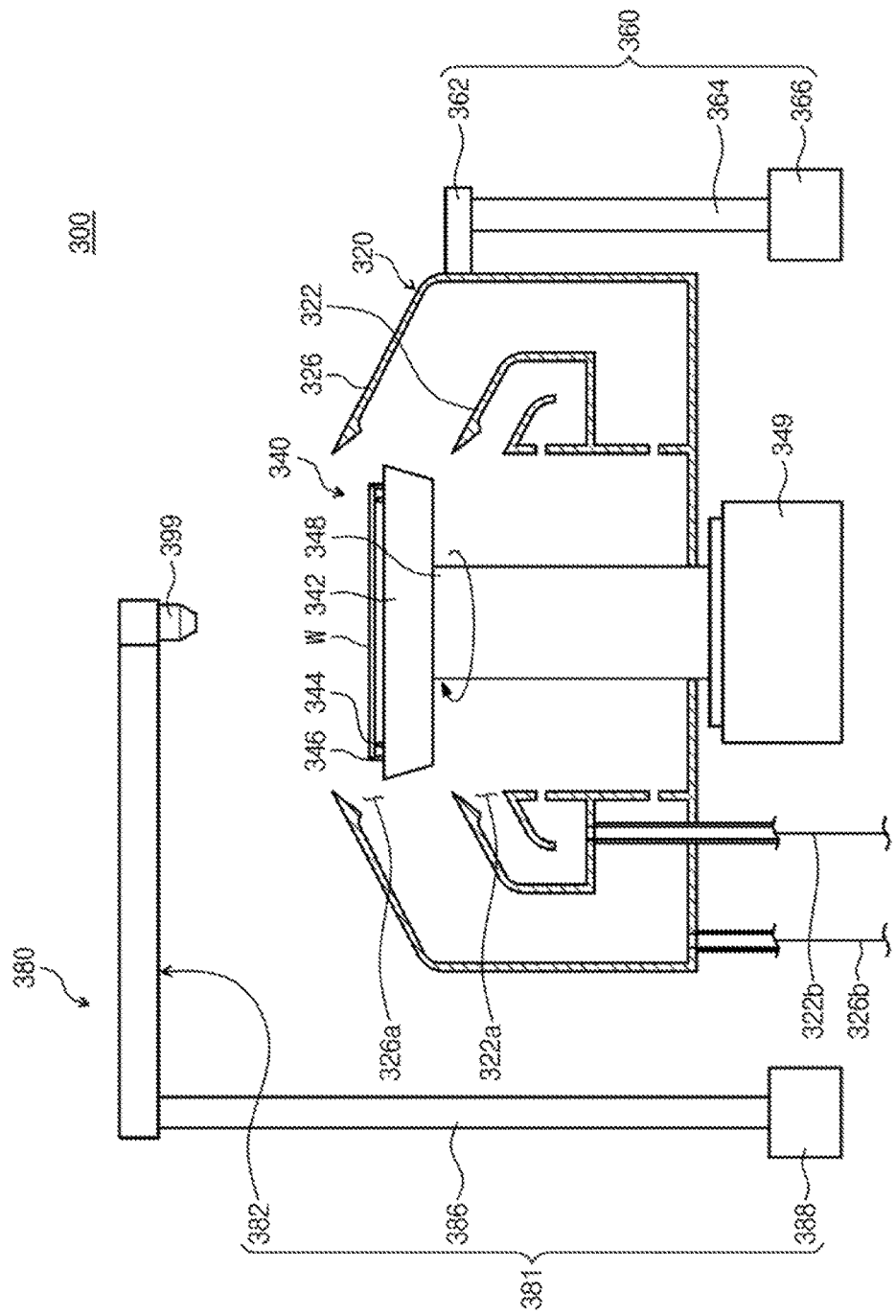
FIG. 4 is a sectional view illustrating an apparatus for cleaning a substrate in a first process chamber of FIG. 1.

Hereinafter, a liquid treating apparatus 300 provided in the first process chamber 260 will be described. FIG. 4 is a sectional view illustrating an apparatus for cleaning a substrate in a first process chamber of FIG. 1. Referring to FIG. 4, the liquid treating apparatus 300 includes a treatment container 320, a spin head 340, an elevation unit 360, and an ejection member 380. The treatment container 320 provides a space in which a liquid treatment process is performed, and an upper side of the treatment container 320 is opened. The treatment container 320 includes an inner recovery vessel 322 and an outer recovery vessel 326. The recovery vessels 322 and 326 recover different treatment liquids used in the process. The inner recovery vessel 322 is provided to have an annular ring shape that surrounds the spin head 340, and the outer recovery vessel 326 is provided to have an annular ring shape that surrounds the inner recovery vessel 322. An inner space 322a of the inner recovery vessel 322 and a space between the outer recovery vessel 326 and the inner recovery vessel 322 function as inlets, through which the treatment liquid is introduced into the inner recovery vessel 322 and the outer recovery vessel 326, respectively. Recovery lines 322b and 326b extending from the recovery vessels 322 and 326 perpendicularly in the downward direction of the bottom surfaces thereof are connected to the recovery vessels 322 and 326, respectively. The recovery lines 322b and 326b discharge the treatment liquids introduced through the recovery vessels 322 and 326, respectively. The discharged treatment liquids may be reused through an external treatment liquid recycling system (not illustrated).

The spin head 340 is a substrate support unit 340 that supports the substrate in the treatment container 320. The spin head 340 supports and rotates the substrate W during the process. The spin head 340 has a body 342, a plurality of support pins 344, a plurality of chuck pins 346, and a support shaft 348. The body 342 has an upper surface having a substantially circular shape when viewed from the top. The support shaft 348 that may be rotated by a motor 349 is fixedly coupled to the bottom of the body 342. A plurality of support pins 344 are provided. The support pins 344 may be arranged to be spaced apart from each other at a periphery of the upper surface of the body 342 and protrude upwards from the body 342. The support pins 344 are arranged to have a generally annular ring shape through combination thereof. The support pins 344 support a periphery of a rear surface of the substrate W such that the substrate W is spaced apart from the upper surface of the body 342 by a predetermined distance. A plurality of chuck pins 346 are provided. The chuck pins 346 are arranged to be more distant from the center of the body 342 than the support pins 344. The chuck pins 346 are provided to protrude upwards from the body 342. The chuck pins 346 support a side of the substrate W such that the substrate W is not separated laterally from a proper place when the spin head 340 is rotated. The chuck pins 346 are provided to be linearly moved between a standby position and a support position along a radial direction of the body 342. The standby position is a position that is more distant from the center of the body 342 than the support position. When the substrate W is loaded on or unloaded from the spin head 340, the chuck pins 346 are located at the standby position, and when a process is performed on the substrate W, the chuck pins 346 are located at the support position. The chuck pins 346 are in contact with the side of the substrate W at the support position.

The elevation unit 360 linearly moves the treatment container 320 upwards and downwards. When the treatment container 320 is moved upwards and downwards, a relative height of the treatment container 320 to the spin head 340 is changed. The elevation unit 360 has a bracket 362, a movable shaft 364, and a driver 366. The bracket 362 is fixedly installed on an outer wall of the treatment container 320, and the movable shaft 364 that is moved upwards and downwards by the driver 366 is fixedly coupled to the bracket 362. The treatment container 320 is lowered such that, when the substrate W is positioned on the spin head 340 or is lifted from the spin head 340, the spin head 340 protrudes to the upper side of the treatment container 320. When the process is performed, the height of the treatment container 320 is adjusted such that the treatment liquid is introduced into the preset recovery vessel 360 according to the kind of the treatment liquid supplied to the substrate W.

Unlike those described above, the elevation unit 360 may move the spin head 340, instead of the treatment container 320, upwards and downwards.

The ejection member 380 supplies the treatment liquid onto the substrate W. A plurality of ejection members 380 may be provided. The ejection members 380 may supply different kinds of treatment liquids. The injection member 380 has a nozzle support 382, a nozzle 384, a support shaft 386, and a driver 388. The lengthwise direction of the support shaft 386 is provided along the third direction 16, and the driver 388 is coupled to a lower end of the support shaft 386. The driver 388 rotates and elevates the support shaft 386. The nozzle support 382 is vertically coupled to an end opposite to an end of the support shaft 386 coupled to the driver 386. The nozzle 384 is installed on the bottom surface of an end of the nozzle support 382. The nozzle 384 is moved to a process location and a standby location by the driver 388. The process location is a location at which the nozzle 384 is arranged at a vertical upper portion of the treatment container 320, and the standby location is a location that deviates from the vertical upper portion of the treatment container 320. For example, the treatment liquid may include a chemical, a rinsing liquid, and an organic solvent. The chemical may be a liquid having a strong acid or alkali property. The rinsing liquid may be pure water. The organic solvent may be a isopropyl alcohol (IPA).liquid.

Figure 5:
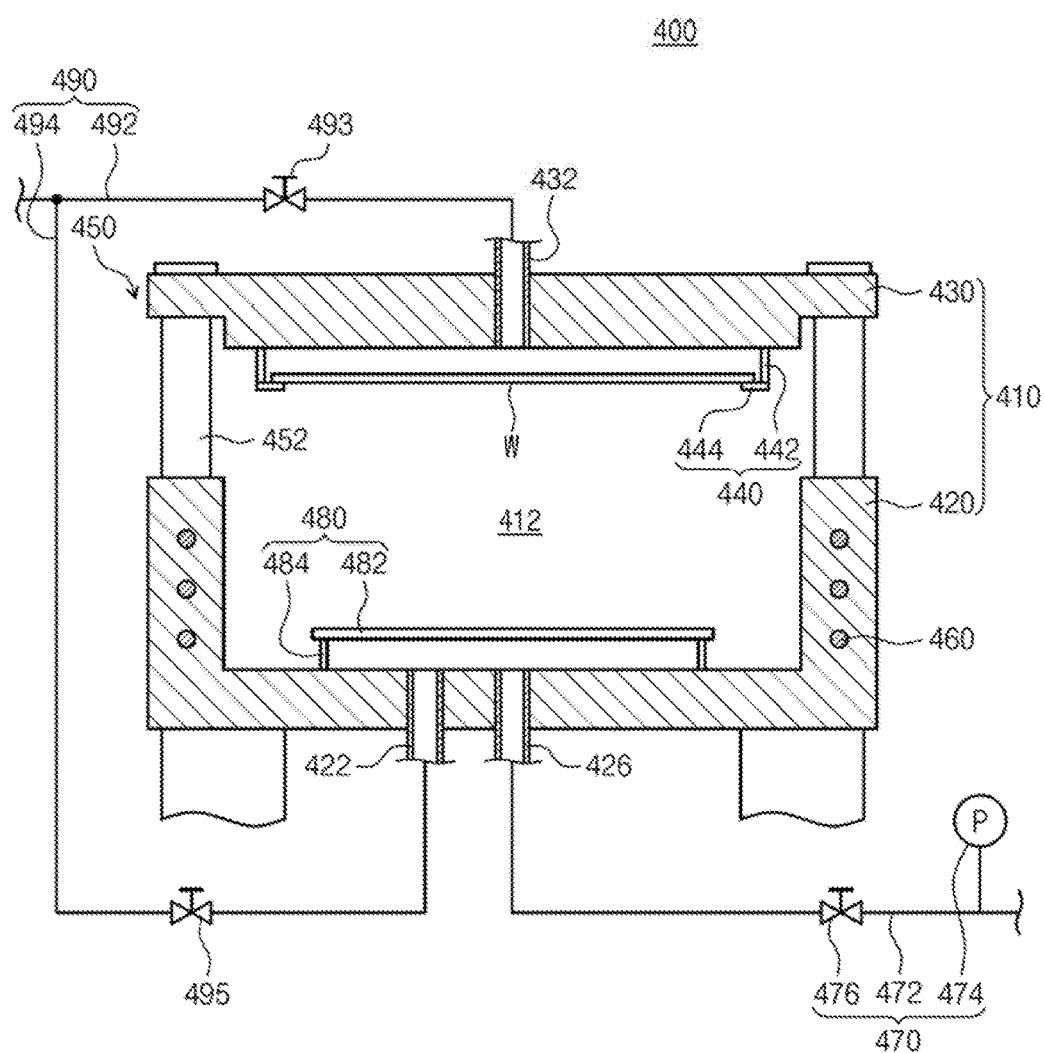
FIG. 5 is a sectional view illustrating an apparatus for drying a substrate in a second process chamber of FIG. 1.

A drying apparatus 400 for performing a substrate drying process is provided in the second process chamber. The drying apparatus 400 dries the substrate W substituted by an organic solvent, by the liquid treating apparatus. The drying apparatus 400 dries the substrate W, on which the organic solvent resides. The drying apparatus 400 may dry the substrate W by using a supercritical solvent. FIG. 5 is a sectional view illustrating an apparatus for drying a substrate in a second process chamber of FIG. 1. Referring to FIG. 5, the drying apparatus 400 includes a high-pressure chamber 410, a substrate support unit 440, a body elevating member 450, a heating member 460, a blocking member 480, an exhaustion unit 470, and a fluid supply unit 490.

The high-pressure chamber 410 defines a treatment space 412 for treating the substrate W therein. The high-pressure chamber 410 closes the treatment space 412 from the outside while the substrate W is treated. The high-pressure chamber 410 includes a lower body 420 and an upper body 430. The lower body 420 has an open-topped cup shape. A lower supply port 422 and an exhaustion port 426 are formed on a bottom surface of an inside of the lower body 420. When viewed from the top, the lower supply port 422 may deviate from a central axis of the lower body 420. The lower supply port 422 functions as a passage, through which the supercritical fluid is supplied to the treatment space 412.

The upper body 430 is combined with the lower body 420 to define a treatment space 412 therebetween. The upper body 430 is located above the lower body 420. The upper body 430 has a tetragonal plate shape. An upper supply port 432 is formed in the upper body 430. The upper supply port 432 functions as a passage, through which the supercritical fluid is supplied to the treatment space 412. The upper supply port 432 may be located to coincide with the center of the upper body 430. A lower end of the upper body 430 may face an upper end of the lower body 420 at a location at which the central axis of the upper body 430 coincides with the central axis of the lower body 420. According to an example, the upper body 430 and the lower body 420 are formed of a metallic material.

Figure 6:
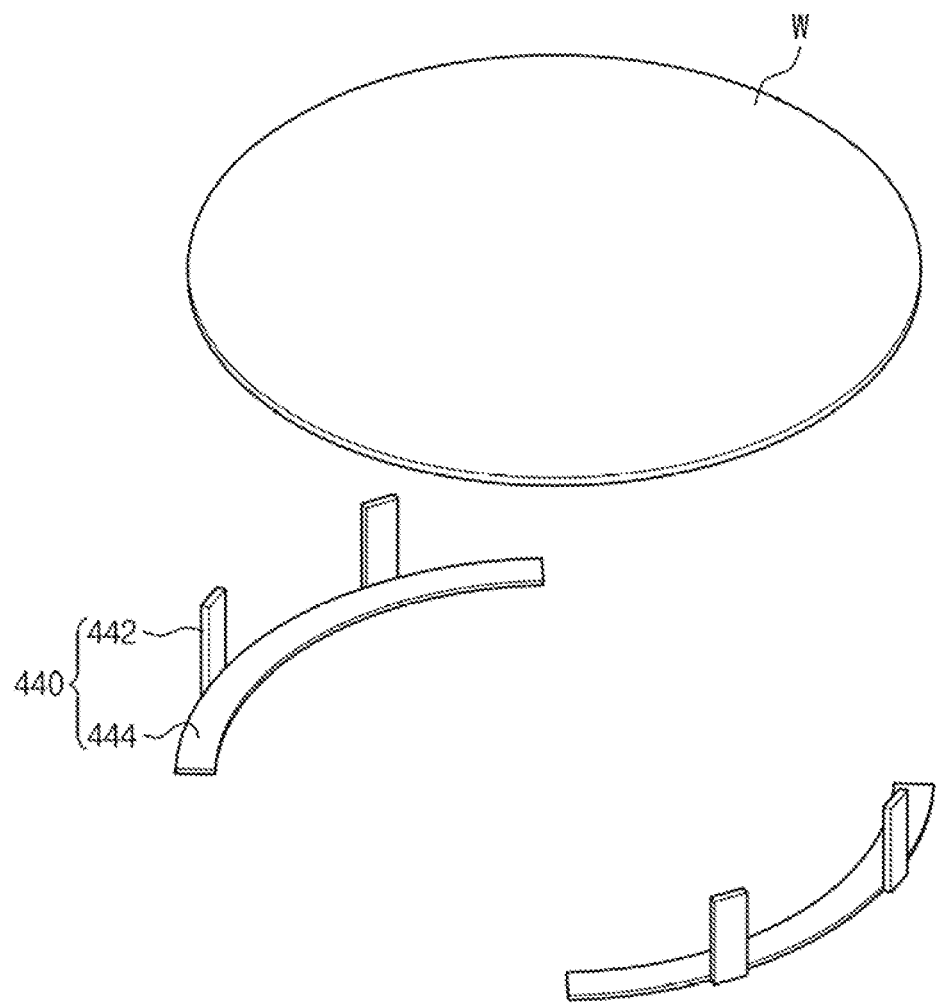
FIG. 6 is a perspective view illustrating a substrate support unit of FIG. 5.

The substrate supporting unit 440 supports the substrate W in the treatment space 412. The substrate support unit 440 supports the substrate W such that a treatment surface of the substrate W faces the upper side. FIG. 6 is a perspective view illustrating a substrate support unit of FIG. 5. Referring to FIG. 5, the substrate support unit 440 includes a support member 442 and a substrate maintaining member 444. The support 442 has a bar shape that extends downwards from a bottom surface of the upper body 430. A plurality of support members 442 are provided. For example, four support members 442 may be provided. The substrate maintaining member 444 supports a peripheral area of a bottom surface of the substrate W. A plurality of substrate maintaining members 444 are provided, and support different areas of the substrate W. For example, two substrate maintaining members 444 may be provided. When viewed from the top, the substrate maintaining member 444 has a rounded plate shape. When viewed from the top, the substrate maintaining member 444 is located inside the support member. The substrate maintaining members 444 are combined with each other to have a ring shape. The substrate maintaining members 444 are spaced apart from each other.

Referring back to FIG. 5, the body elevating member 450 adjusts a relative location between the upper body 430 and the lower body 420. The body elevating member 450 moves one of the upper body 430 and the lower body 420 upwards and downwards. It is described in the embodiment that a location of the upper body 430 is fixed and a distance between the upper body 430 and the lower body 420 is adjusted by moving the lower body 420. Optionally, the substrate support unit 440 installed in the fixed lower body 420, and the upper body 430 may be moved. The body elevating member 450 moves the lower body 420 such that a relative location between the upper body 430 and the lower body 420 may be moved from an opened location to a closed location. Here, the opened location is defined as a location at which the upper body 430 and the lower body 420 are spaced apart from each other such that the treatment space 412 communicates with the outside, and the closed location is defined as a location at which the upper body 430 and the lower body 420 contact each other such that the treatment space 412 is closed from the outside by the upper body 430 and the lower body 420. The body elevating member 450 elevates the lower body 420 to open or close the treatment space 412. The body elevating member 450 includes a plurality of elevation shafts 452 that connects the upper body 430 and the lower body 420. The elevation shafts 452 are located between an upper end of the lower body 420 and the upper body 430. The elevation shafts 452 are arranged along a periphery of an upper end of the lower body 420. The elevation shafts 452 may pass through the upper body 430 to be fixedly coupled to an upper end of the lower body 420. As the elevation shafts 452 is lifted or lowered, the height of the lower body 420 is changed and a distance between the upper body 430 and the lower body 420 may be adjusted.

The heating member 460 heats the treatment space 412. The heating member 460 heats the supercritical fluid supplied to the treatment space 412 to a critical temperature or higher to maintain a phase of the supercritical fluid. The heating member 460 may be buried and installed in at least one wall of the upper body 430 and the lower body 420. For example, the heating member 460 may be a heater 460 that receive electric power from the outside to generate heat.

The blocking member 480 prevents the supercritical fluid supplied from the lower supply port 474 from being directly supplied to a non-treatment surface of the substrate W. The blocking member 480 may include a blocking plate 482 and a support 484. The blocking plate 482 is located between the lower supply port 474 and the substrate support unit 440. The blocking plate 482 has a disk shape. The blocking plate 482 has a diameter that is smaller than an inner diameter of the lower body 420. When viewed from the top, the blocking plate 482 has a diameter by which both of the lower supply port 474 and the exhaustion port 426 are covered. For example, the blocking plate 482 may correspond to the diameter of the substrate W or have a larger diameter. The support 484 supports the blocking plate 482. A plurality of supports 484 are provided to be arranged along a circumferential direction of the blocking plate 482. The supports 484 are arranged to be spaced apart from each other by a specific interval.

The exhaustion unit 470 naturally exhausts the atmosphere of the treatment space 412. The process side-products generated in the treatment space 412 are exhausted through the exhaustion unit 470. Further, the exhaustion unit 470 may adjust a pressure of the treatment space 412 while exhausting the process side-products. The exhaustion unit 470 includes an exhaust line 472 and a pressure measuring member 474. The exhaust line 472 is connected to the exhaust port 426. An exhaust valve 476 installed in the exhaust line 472 may adjust an amount of exhaust gas of the treatment space 412. The pressure measuring member 474 is installed in the exhaust line 472 to measure a pressure of the exhaust line 472. The pressure measuring member 474 is located on an upstream side of the exhaust valve 476 with respect to an exhaustion direction.

The fluid supply unit 490 supplies a treatment fluid to the treatment space 412. The treatment space is supplied in a supercritical state by a supercritical temperature and a supercritical pressure. The fluid supply unit 490 includes an upper supply line 492 and a lower supply line 494. The upper supply line 492 is connected to the upper supply port 432. The treatment fluid is supplied to the treatment space 412 sequentially via the upper supply line 492 and the upper supply port 432. An upper valve 493 is installed in the upper supply line 492. The upper valve 493 opens and closes the upper supply line 492. The lower supply line 494 connects the upper supply line 492 and the lower supply port 422. The lower supply line 494 is branched from the upper supply line 492 and is connected to the lower supply port 422. That is, the treatment fluids supplied from the upper supply line 492 and the lower supply line 494 may be the same kind of fluid. The treatment fluid is supplied to the treatment space 412 sequentially via the lower supply line 494 and the lower supply port 422. A lower valve 495 is installed in the lower supply line 494. The lower valve 495 opens and closes the lower supply line 494.

The controller 600 controls the transfer unit 240. The controller 600 receives weight information of the substrate W from the transfer unit 240 and calculates the weight of the remained liquid on the substrate W. The controller 600 receives a pre-treatment weight of the substrate W measured before the substrate W is carried into the first processor chamber 260. Thereafter, the controller 600 receives a post-treatment weight of the substrate W liquid-treated in the first processor chamber 260. The controller 600 calculates the weight of the remained liquid on the substrate W based on a difference between the pre-treatment weight and the post-treatment weight of the substrate W. If the calculated weight of the liquid deviates from a preset range, the controller 600 may adjust the amount of the discharged organic solvent such that the weight of the liquid is within the preset range. For example, the preset range may be 6 g to 16 g.

Figure 7:
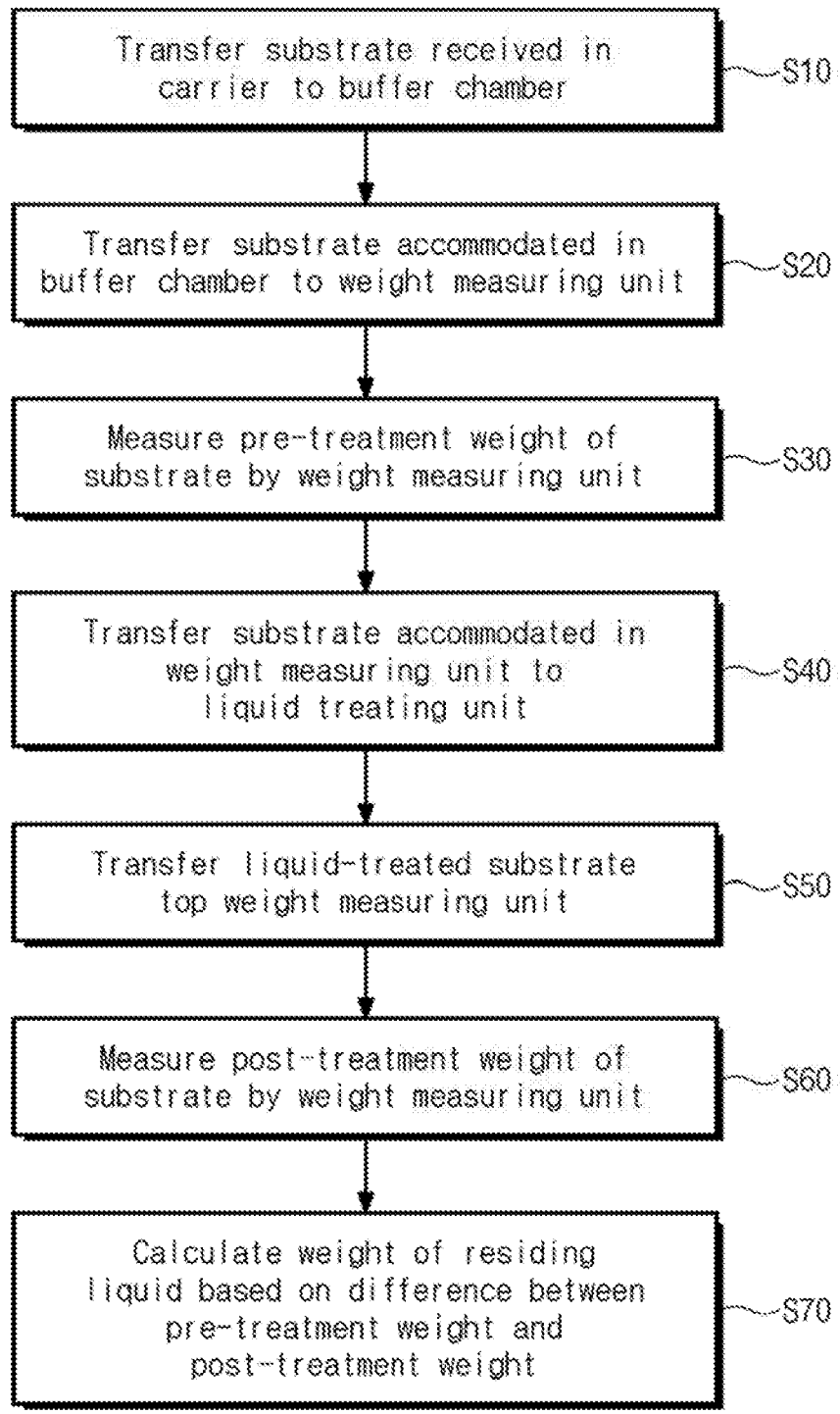
FIG. 7 is a flowchart illustrating a process of setting up the substrate treating system of FIG. 1.
Figure 8:
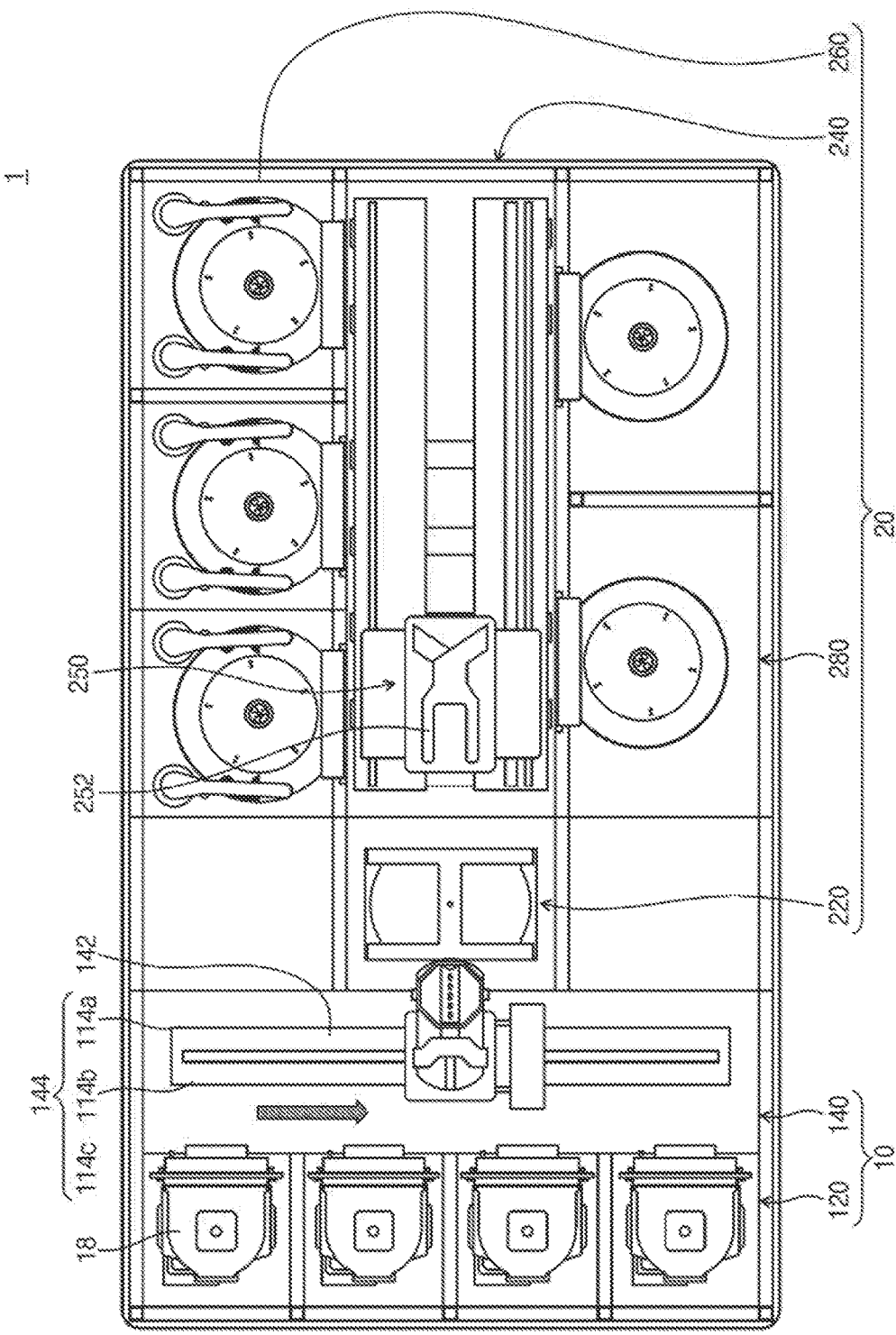
FIGS. 8 to 10 are views illustrating a process of transferring a substrate while the substrate treating system of FIG. 1 is set up.
Figure 9:
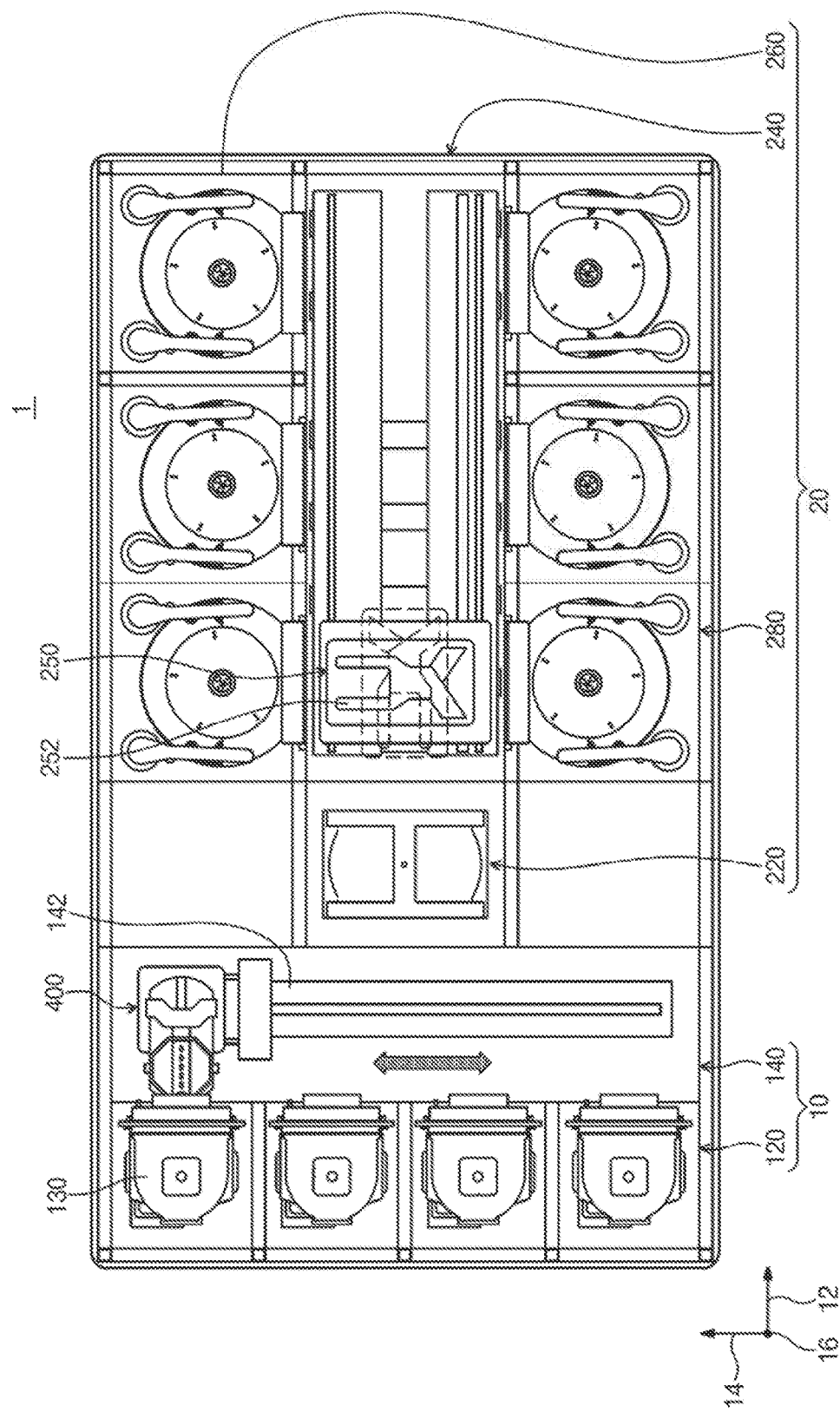
Figure 10:
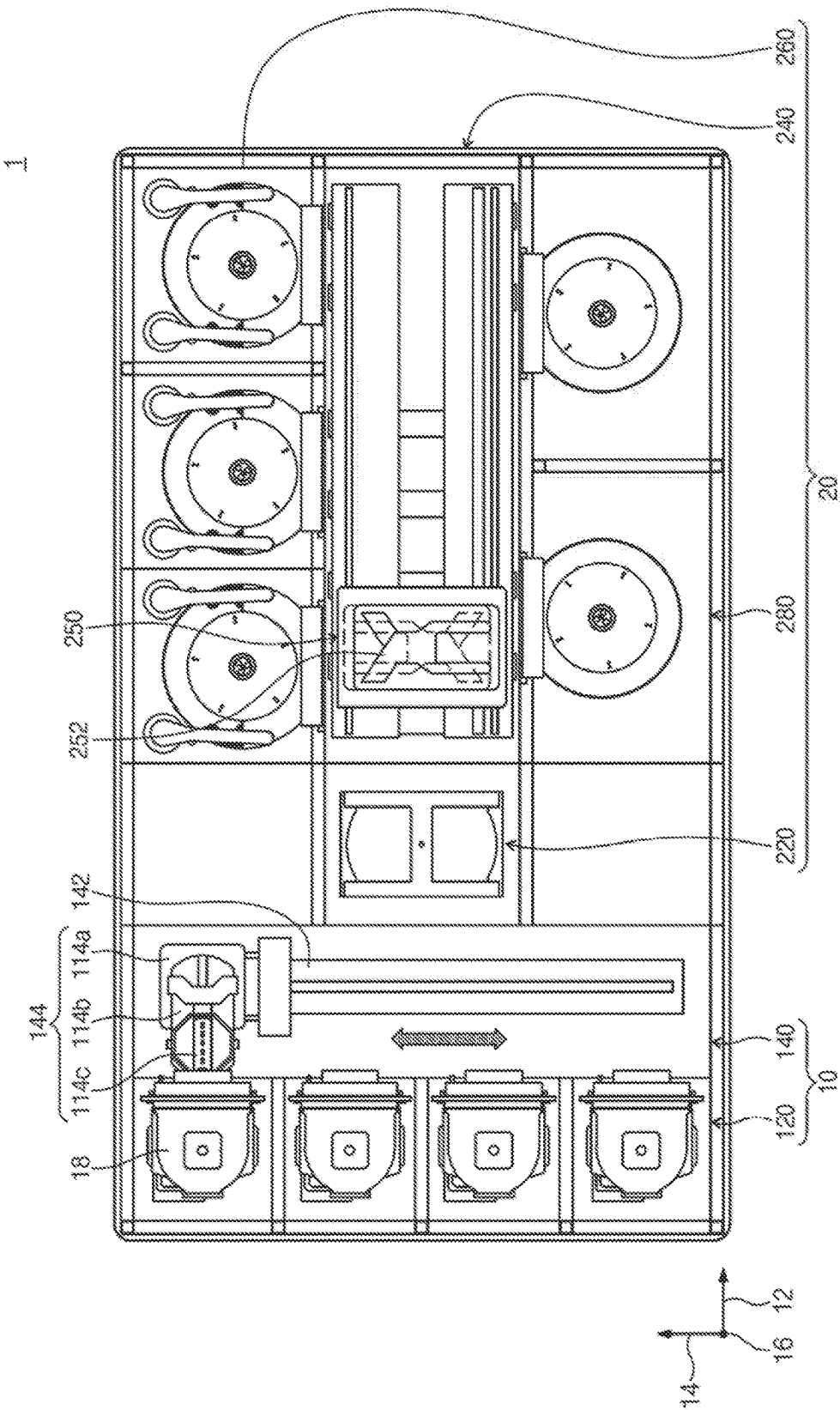

Hereinafter, a process of setting up the above-mentioned substrate treating apparatus will be described. The setup of the apparatus includes a process of measuring a weight of a liquid. FIG. 7 is a flowchart illustrating a process of setting up the substrate treating system of FIG. 1. FIGS. 8 to 10 are views illustrating a process of transferring a substrate while the substrate treating system of FIG. 1 is set up. Referring to FIGS. 7 to 10, the process of measuring the weight of the remained liquid on the substrate W includes a liquid treating operation and a weight measuring operation. The liquid treating operation is an operation of supplying a treatment liquid onto the substrate W, and the weight measuring operation is an operation of measuring the weight of the substrate W. The weight measuring operation includes a pre-treatment measurement operation and a post-treatment measurement operation. The pre-treatment measurement operation is an operation of measuring the weight of the substrate W before the liquid treating operation, and the post-treatment measurement operation is an operation of measuring the weight of the substrate W after the liquid treating operation.

The substrate W received in the carrier 18 is transferred to the buffer space 224 by the index robot 144 (S10). If the substrate W is positioned on the slot member 226, the transfer robot 250 extracts the substrate W and transfers the substrate W to the weight measuring unit 500 (S20). If the substrate W is carried into the weight measuring unit 500, the pre-treatment operation S30 is performed.

In the pre-treatment operation S30, a pre-treatment weight of the substrate W is measured. The measured pre-treatment weight of the substrate W is delivered to the controller 600. If the weight of the substrate W is completely measured, the transfer robot 250 extracts the substrate W from the weight measuring unit 500 and transfers the substrate W to the first process chamber 260 (S40) to perform a liquid treating operation.

In the liquid treating operation, a chemical, a rinsing liquid, and an organic solvent are sequentially supplied onto the substrate W. If the liquid treating operation is performed, the transfer unit 240 loads the substrate W in the spin head 340. The loaded substrate W is rotated by the spin head 340. The chemical cleans the substrate W, and the rinsing liquid rinses the chemical residing on the substrate W. The rinsing remained liquid on the substrate W is substituted by an organic solvent. If the liquid treating operation is completed, the transfer robot 250 transfers the substrate W to the weight measuring unit 500 (S50). If the substrate W is carried into the weight measuring unit 500, the post-treatment operation S60 is performed.

In the post-treatment operation S60, the weight of the substrate W is measured. The measured post-treatment weight of the substrate W is delivered to the controller 600, and the weight of the organic solvent residing on the substrate W is calculated through the difference between the pre-treatment weight and the post-treatment weight (S70).

If the calculated weight of the organic solvent deviates from a preset range, the flow amount of the organic solvent of the ejection member is adjusted. For example, if the weight of the remained liquid is greater than the preset range, the flow amount of the organic solvent may be reduced and if the weight of the remained liquid is smaller than the preset range, the flow amount of the organic solvent may be increased. Optionally, the atmosphere of the interior of the substrate treating system may be adjusted. Here, the atmosphere of the interior of the substrate treating system may include temperature and humidity.

According to the embodiment, the weight of the substrate W is measured in the substrate treating system. Accordingly, the weight of the substrate W may be measured in an actual process atmosphere at which the substrate W is treated, and a proper amount of the remained liquid may be detected during a process. Accordingly, a process defect due to a lack or an excessive supply of the liquid may be prevented.

Further, the measurement of the weight of the remained liquid may be automated without an operator, the measurement speed may be high and the body of an operator may be prevented from being influenced due to exposure of a liquid.

Figure 11:
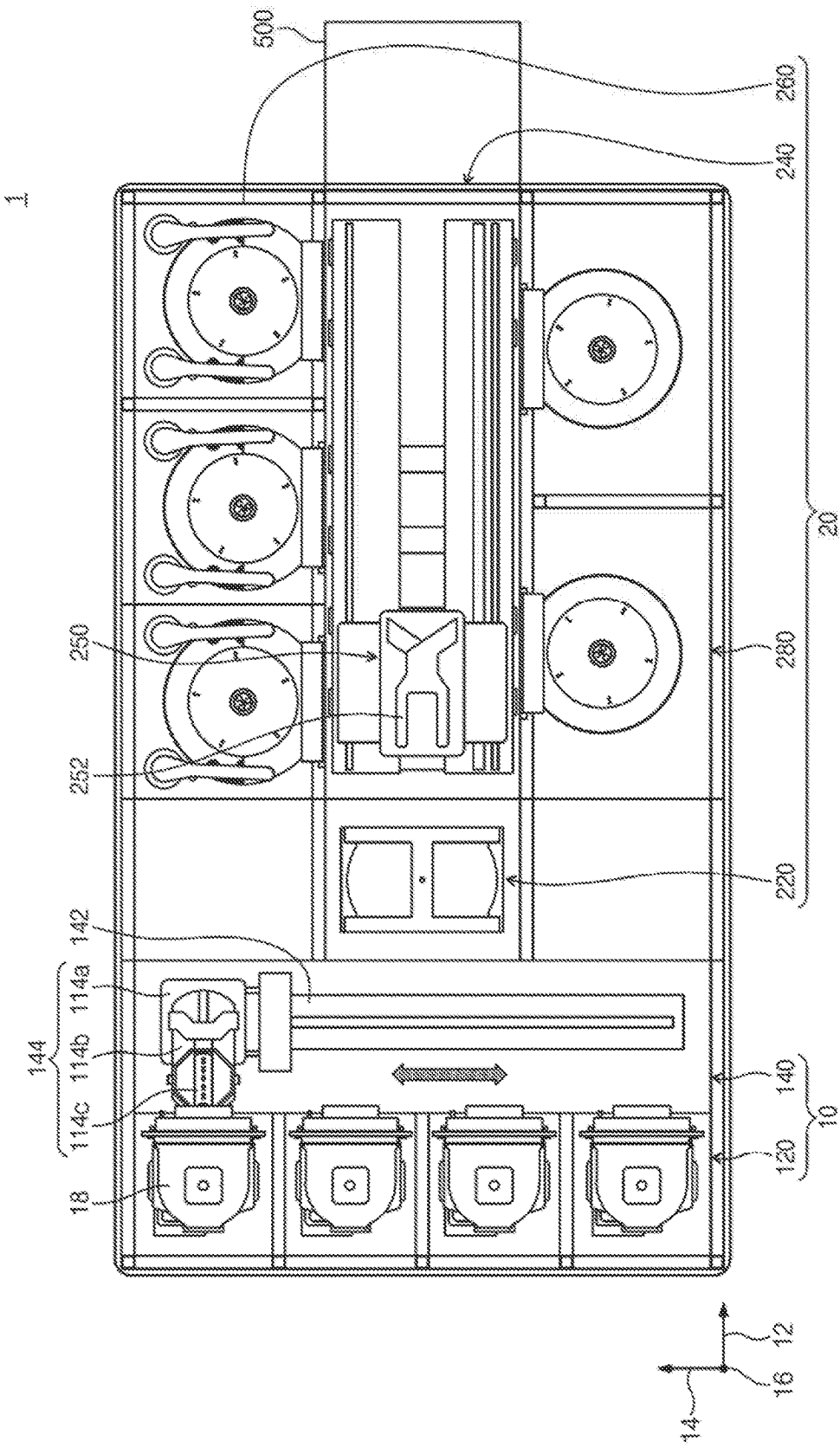
FIG. 11 is a plan view illustrating another embodiment of the substrate treating system of FIG. 1.

It has been described in the embodiment that the weight measuring unit 500 is located to be stacked on the buffer unit 220. However, as illustrated in FIG. 11, the weight measuring unit 500 may face the buffer unit 220 while the transfer chamber 242 is located therebetween.

According to the embodiment of the inventive concept, the measurement of the weight of the remained liquid is performed by the weight measuring unit transferred by the transfer unit. Accordingly, the weight of the remained liquid may be measured more promptly.

Further, according to the embodiment of the inventive concept, the measurement of the weight of the remained liquid is performed in an apparatus while the substrate is not extracted to the outside of the apparatus. Accordingly, the weight of the remained liquid may be measured without being influenced by the external environment of the apparatus.

Further, according to the embodiment of the inventive concept, the measurement of the weight of the remained liquid is performed in an apparatus while the substrate is not extracted to the outside of the apparatus. Accordingly, the remained liquid may be prevented from being exposed to the operator.

What is claimed is:

1. An apparatus for treating a substrate, the apparatus comprising:
an index module including a plurality of load ports and a feeding frame; and
a process treating module, wherein the process treating module comprises:
a buffer unit comprising a buffer chamber and a weight measuring unit, wherein the buffer chamber accommodates the substrate and the weight measuring unit measures a weight of a remained liquid on the substrate;
a liquid treating unit that liquid-treats the substrate by supplying liquid onto the substrate;

a drying unit that dries the substrate liquid-treated by the liquid treating unit by using a supercritical solvent; and a transfer unit that transfers the substrate between the liquid treating unit, the drying unit, and the weight measuring unit, wherein the buffer unit is arranged between the feeding frame and the transfer unit, wherein the weight measuring unit includes a housing having a measurement space and a measurement member located in the measurement space, wherein an opening is formed on one side surface of the housing facing the transfer unit, and the opening is an inlet through which the substrate is carried into the measurement space, and wherein the weight measuring unit and the buffer chamber are stacked on each other.

2. The apparatus of claim 1, wherein the liquid includes isopropyl alcohol (IPA).

3. The apparatus of claim 1, further comprising:
a controller that controls the transfer unit, wherein the controller controls the transfer unit to transfer the substrate to the weight measuring unit before the substrate is carried into the liquid treating unit, and transfer the substrate treated by the liquid treating unit to the weight measuring unit.

4. The apparatus of claim 3, wherein the controller receives a pre-treatment weight of the substrate from the weight measuring unit before the substrate is carried into the liquid treating unit and receives a post-treatment weight of the substrate carried out of the liquid treating unit from the weight measuring unit, and calculates the weight of the remained liquid on the substrate based on a difference between the pre-treatment weight and the post-treatment weight.

5. The apparatus of claim 4, wherein if the calculated weight of the liquid deviates from a preset value, the controller adjusts a flow amount of the liquid supplied from the liquid treating unit such that the weight of the liquid includes the preset value.

* * * * *